United States Patent
Torii et al.

(10) Patent No.: US 11,682,688 B2
(45) Date of Patent: Jun. 20, 2023

(54) PHOTOELECTRIC CONVERTING DEVICE AND APPARATUS

(71) Applicant: CANON KABUSHIKI KAISHA, Tokyo (JP)

(72) Inventors: Keita Torii, Naka-gun (JP); Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/659,765

(22) Filed: Oct. 22, 2019

(65) Prior Publication Data

US 2020/0135793 A1   Apr. 30, 2020

(30) Foreign Application Priority Data

Oct. 29, 2018 (JP) .................................. 2018-202787

(51) Int. Cl.
H01L 27/146 (2006.01)

(52) U.S. Cl.
CPC .. H01L 27/14636 (2013.01); H01L 27/14621 (2013.01); H01L 27/14632 (2013.01); H01L 27/14645 (2013.01); H01L 27/14627 (2013.01)

(58) Field of Classification Search
CPC ......... H01L 27/14632; H01L 27/14687; H01L 27/1464; H01L 27/1463; H01L 27/14634
See application file for complete search history.

(56) References Cited

U.S. PATENT DOCUMENTS

| 2005/0104148 A1* | 5/2005 | Yamamoto | H01L 27/14625 257/432 |
| 2010/0164035 A1* | 7/2010 | Kim | H01L 27/1463 257/432 |
| 2010/0230773 A1* | 9/2010 | Nakazawa | H01L 27/14689 257/459 |
| 2011/0084350 A1 | 4/2011 | Murakoshi et al. | |
| 2011/0127629 A1 | 6/2011 | Yorikado et al. | |
| 2013/0069190 A1* | 3/2013 | Kao | H01L 27/1463 257/432 |

(Continued)

FOREIGN PATENT DOCUMENTS

| JP | 2005-268738 A | 9/2005 |
| JP | 2011-114325 A | 6/2011 |

(Continued)

OTHER PUBLICATIONS

U.S. Appl. No. 16/601,888, filed Oct. 15, 2019 (First Named Inventor: Sho Suzuki).

(Continued)

*Primary Examiner* — Peter M Albrecht
(74) *Attorney, Agent, or Firm* — Venable LLP

(57) ABSTRACT

A photoelectric converting device including: a semiconductor layer with a front surface and a back surface, the semiconductor layer including a photoelectric conversion portion; a wire structure including an insulating film, the wire structure being disposed on the front surface of the semiconductor layer; a first insulator portion disposed in a trench provided in the semiconductor layer; and a second insulator portion disposed between the first insulator portion and the insulating film, wherein the first insulator portion has a maximum width larger than a maximum width of the second insulator portion.

15 Claims, 12 Drawing Sheets

(56) References Cited

U.S. PATENT DOCUMENTS

| | | | |
|---|---|---|---|
| 2013/0285181 A1* | 10/2013 | Lin .................... | H01L 27/1463 |
| | | | 257/432 |
| 2013/0320479 A1* | 12/2013 | Ahn ....................... | H01L 31/18 |
| | | | 257/460 |
| 2015/0221692 A1 | 8/2015 | Enomoto et al. | |
| 2015/0372031 A1* | 12/2015 | Yoon .................. | H01L 27/1463 |
| | | | 257/446 |
| 2016/0027833 A1 | 1/2016 | Yamamoto et al. | |
| 2019/0123088 A1* | 4/2019 | Kwon ............... | H01L 27/14609 |

FOREIGN PATENT DOCUMENTS

| | | |
|---|---|---|
| JP | 2012-124280 A | 6/2012 |
| JP | 2014-033107 A | 2/2014 |
| JP | 2016-025255 A | 2/2016 |

OTHER PUBLICATIONS

Office Action dated Nov. 8, 2022, in Japanese Patent Application No. 2018-202787.

* cited by examiner

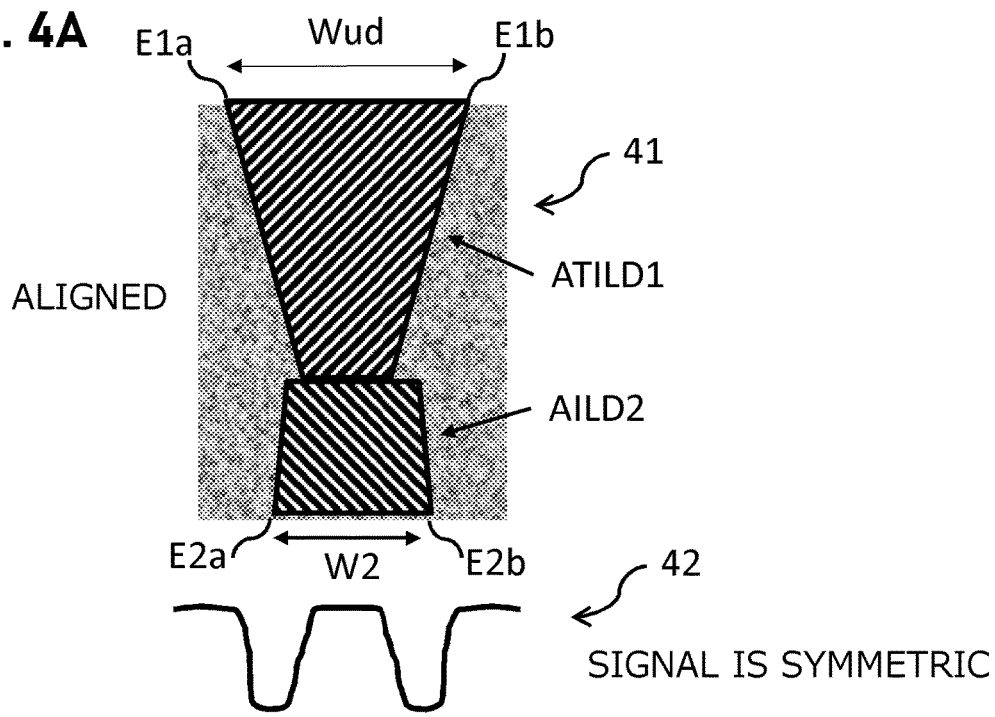
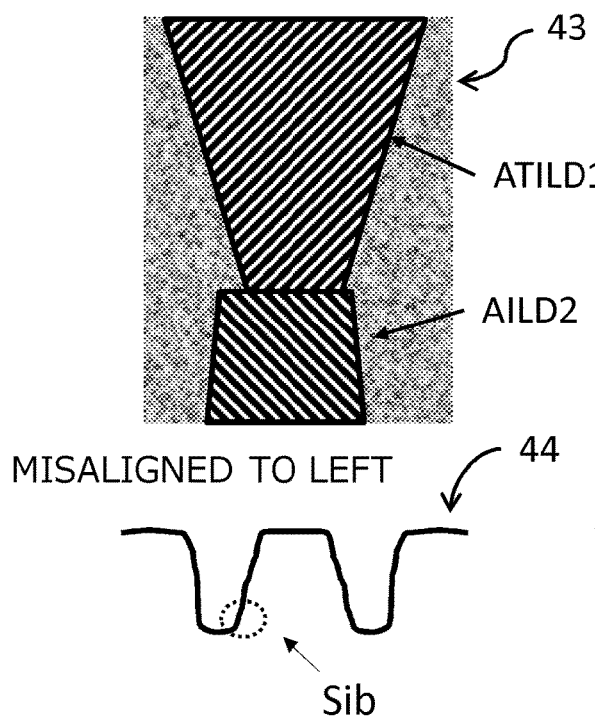
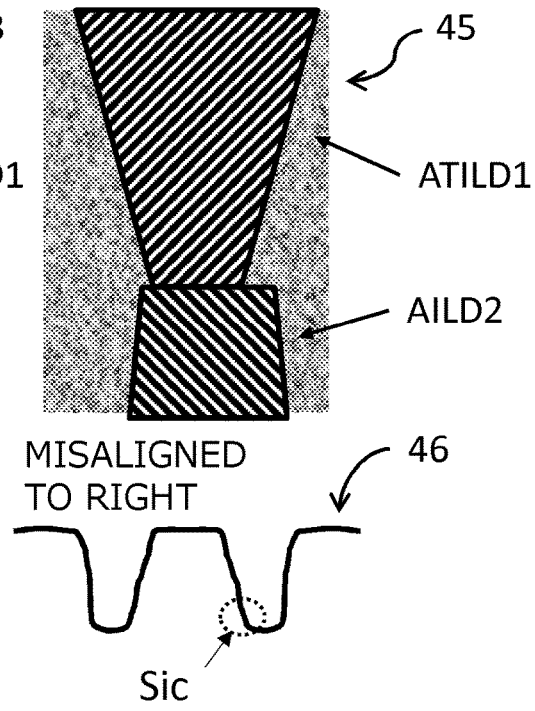

PRESENT TECHNIQUE

FIG. 11C 113 (SiO) 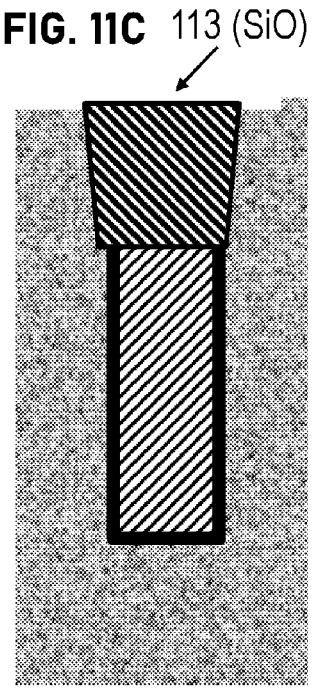
111 (Si)  112 (SiN)

3μm

ALIGNED

SIGNAL IS SYMMETRIC

MISALIGNED TO LEFT
SIGNAL IS ASYMMETRIC

MEASUREMENT MISALIGNMENT TO LEFT

MISALIGNED TO RIGHT
SIGNAL IS ASYMMETRIC

MEASUREMENT MISALIGNMENT TO RIGHT

PHOTOELECTRIC CONVERTING DEVICE AND APPARATUS

BACKGROUND OF THE INVENTION

Field of the Invention

The present invention relates to a photoelectric converting device.

Description of the Related Art

A photoelectric converting device has a light-receiving part including a photodiode formed for each pixel. The light-receiving part generates a signal charge by photoelectric conversion according to incident light. In a charge-coupled device (CCD) sensor, a signal charge generated in a light-receiving part is transferred through a charge transfer part having a CCD structure, is converted into a pixel signal in an output part, and is outputted therefrom. In a complementary metal-oxide semiconductor (CMOS) sensor, a signal charge generated in a light-receiving part is amplified for each pixel and the amplified signal is outputted as a pixel signal by a signal line. In order to improve the efficiency of light collection, back-side illumination (BSI) sensors are proposed. A BSI sensor shortens a distance between a photodiode formed on a substrate and a plane of light incidence and allows light to be incident from an opposite side (back surface side) from a side where the wiring structure of the substrate is formed.

The BSI sensor is manufactured as follows: first, the wiring structure is formed on a substrate surface having the photodiode and a pixel transistor. The substrate is then inverted. Thereafter, the inverted substrate is bonded to another wafer where a wiring structure and an electronic circuit, e.g., an application-specific integrated circuit (ASIC) are formed. Subsequently, a silicon layer on the back surface side of the bonded wafer is ground to a smaller thickness and then a color filter layer and a microlens are formed on the back surface side of the substrate. As described above, in the BSI sensor, the color filter layer and the microlens are formed on the back surface side of the substrate after the substrate is inverted. Thus, it is necessary to form an alignment mark for positioning the color filter layer and the microlens.

Such an alignment mark is proposed in Japanese Patent Application Publication No. 2011-114325. FIG. 9 is a cross-sectional view illustrating an example of the alignment mark.

As illustrated in FIG. 9, an alignment mark AM of Japanese Patent Application Publication No. 2011-114325 includes an insulator portion AILD1 (upper insulator portion AILD1) that is made of an insulating material embedded so as to penetrate silicon and an insulator portion AILD2 (lower insulator portion AILD2) that is disposed under the insulator portion AILD1. The insulator portion AILD2 under the insulator portion AILD1 has a larger width than the insulator portion AILD1 as illustrated in FIG. 9. This configuration enables the lower insulator portion AILD2 to act as a protective film, can prevent short circuits (electrical short circuits) caused by the deposition of polysilicon, and can prevent wafer contamination and device contamination if a silicon oxide film is peeled off.

Moreover, in a BSI sensor, it is necessary to form an opening facing an electrode-pad formation area from the back surface side of a substrate in order to draw an electrode pad PAD, which is formed in a wiring structure on the front surface side of the substrate, to the back surface side of the substrate. The electrode-pad formation area is exposed from the opening, forming a bonding wire or the like as an external wire so as to draw the electrode pad PAD to the back surface side of the substrate. During wire bonding to the electrode pad PAD or probing to the electrode pad PAD in a process of inspection, it is necessary to insulate the bonding wire from a semiconductor part in order to suppress leakage or damage even if the electrode pad PAD is brought into contact with a side wall by mistake. Thus, the two layers of insulator portions ILD1 and ILD2 are disposed around the opening. Like the alignment mark AM (AILD1 and AILD2), the two layers of the insulator portions are configured such that the lower insulator portion ILD2 protects the upper insulator portion ILD1.

In Japanese Patent Application Publication No. 2011-114325, the alignment mark and the two layers of the insulator portions around the electrode pad opening are formed at the same time.

Our examination proved that using the alignment mark described in Japanese Patent Application Publication No. 2011-114325 may deteriorate the manufacturing yield or quality of a solid-stage imaging device.

SUMMARY OF THE INVENTION

The present invention provides an advantageous technique for improving the manufacturing yield and quality of a photoelectric converting device as compared with the related art.

The first aspect of the present disclosure is a photoelectric converting device including:

a semiconductor layer with a front surface and a back surface, the semiconductor layer including a photoelectric conversion portion;

a wire structure including an insulating film, the wire structure being disposed on the front surface of the semiconductor layer;

a first insulator portion disposed in a trench provided in the semiconductor layer; and a second insulator portion disposed between the first insulator portion and the insulating film, wherein the first insulator portion has a maximum width larger than a maximum width of the second insulator portion.

The present disclosure provides an advantageous technique for improving the manufacturing yield and quality of a photoelectric converting device.

Further features of the present invention will become apparent from the following description of exemplary embodiments with reference to the attached drawings.

BRIEF DESCRIPTION OF THE DRAWINGS

FIGS. 4A to 4C are explanatory drawings of the reasons why an alignment error does not occur in Embodiment 1;

FIGS. 11A to 11E are explanatory drawings illustrating the steps of forming an alignment mark according to the related art.

DESCRIPTION OF THE EMBODIMENTS

<Problems of Conventional Alignment Mark>

Our examination proved that using the alignment mark described in Japanese Patent Application Publication No. 2011-114325 may deteriorate the accuracy of alignment.

The accuracy deteriorates because from among the two layers of the insulator portions AILD1 and AILD2 constituting the alignment mark AM, the lower insulator portion AILD2 is also observable during alignment measurement. Thus, if an error occurs in the state of alignment between the upper insulator portion AILD1 and the lower insulator portion AILD2 and causes a misalignment between the two layers, the position of the alignment mark AM cannot be correctly detected and the accuracy of alignment decreases.

Figure 10:
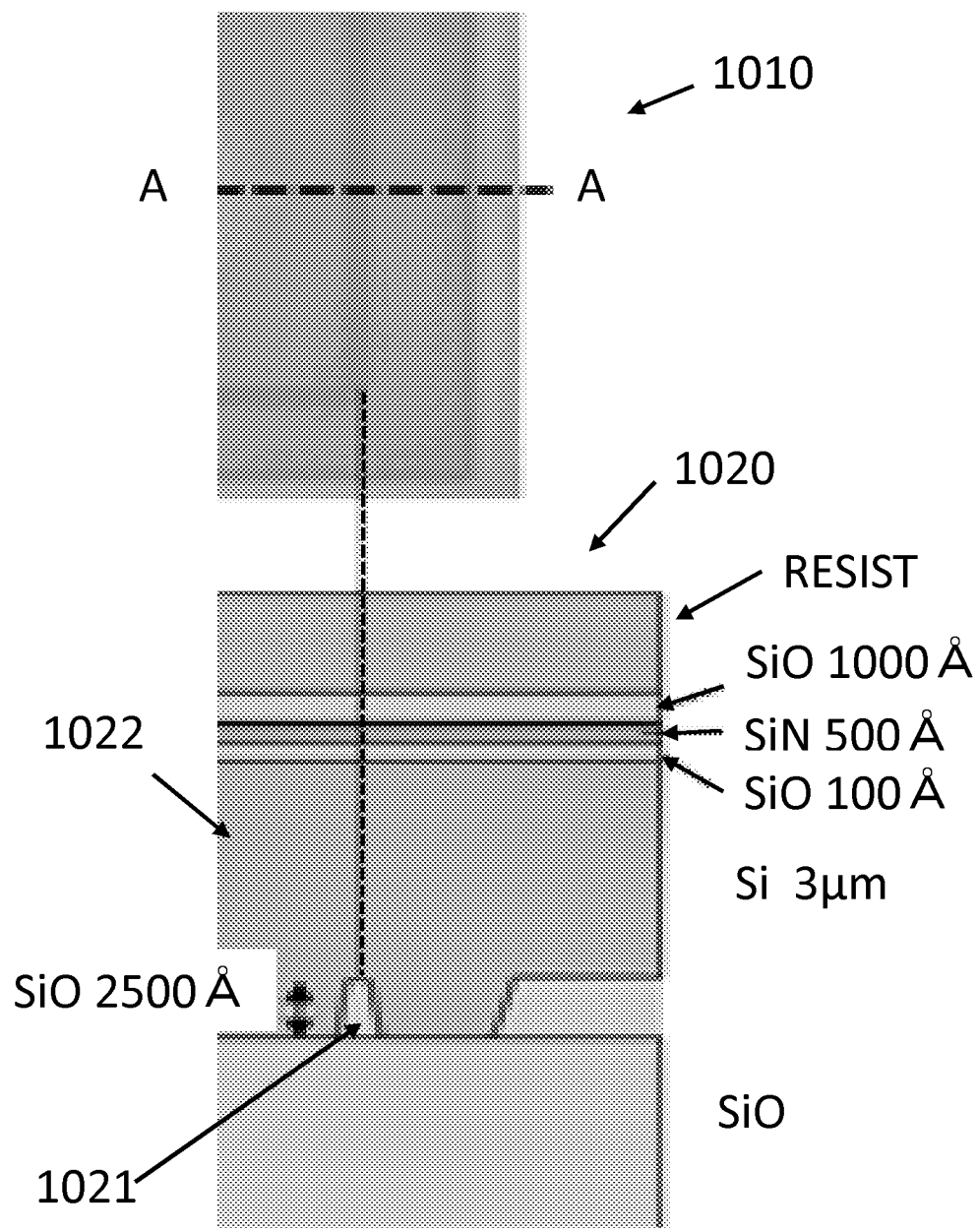
FIG. 10 illustrates an observed image of a BSI longitudinal structure.

FIG. 10 illustrates the alignment mark AM used for the examination. An alignment detection system (see FIG. 3) detects the alignment mark by image processing. Specifically, the alignment mark (a detail drawing in FIG. 2) on the wafer is illuminated with light at a wavelength of 550 nm to 700 nm, an image of light reflected from the wafer is formed on a CCD camera with an optical magnification of at least 100 times, and the optical image of the alignment mark is photoelectrically converted to obtain an image signal. Thereafter, image processing is performed on the image signal, so that the position of the alignment mark is detected with sub-nanometer accuracy.

FIG. 10 illustrates a top view 1010 of the alignment mark AM used for the examination and a cross-sectional view 1020 taken along line AA. The structure of FIG. 10 is a longitudinal structure similar to a BSI structure. FIG. 10 shows that a pattern 1021 of the height of a silicon oxide film SiO (2500 Å) can be observed through a silicon 1022 having a thickness of 3 μm. If the image has a sufficiently high contrast, the alignment mark penetrating the silicon as proposed in Japanese Patent Application Publication No. 2011-114325 is not necessary. Although the pattern 1021 can be observed as illustrated in FIG. 10, the contrast is too low to enable a sub-nanometer measurement.

If the alignment mark in FIG. 10 is used, the accuracy of alignment is deteriorated by a low-contrast image. For the explanation of the accuracy of alignment, how the alignment mark is formed will be discussed below with reference to FIGS. 11A to 11E.

Figure 11A:
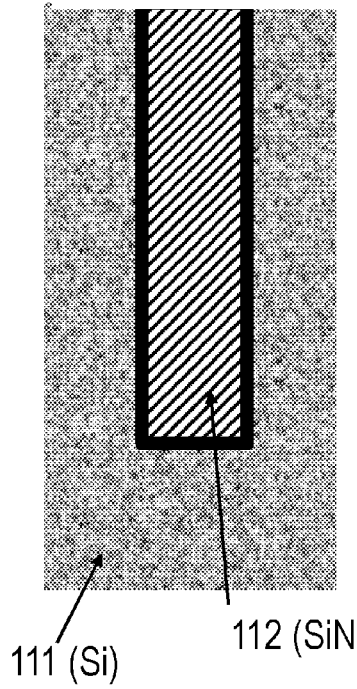

First, as illustrated in FIG. 11A, a trench (groove) is formed on a silicon wafer 111 by the exposure, development, and etching of lithography, and then a silicon nitride film (SiN) 112 is embedded into the trench. The trench serves as "upper insulator portion AILD1", which will be described later (in FIGS. 11A to 11C, the silicon nitride film (SiN) 112 is disposed in a lower part because the substrate will be vertically inverted later).

Figure 11B:
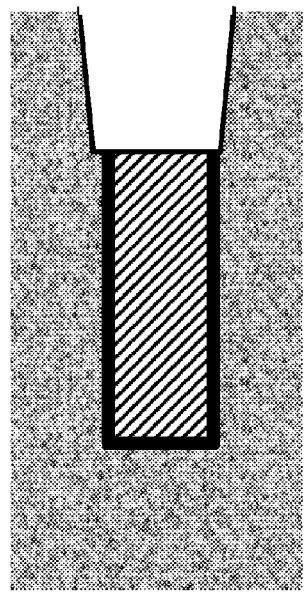

Subsequently, as illustrated in FIG. 11B, a pattern serving as "lower insulator portion AILD2" is formed on "upper insulator portion AILD1" by the alignment, exposure, development, and etching of lithography using the alignment mark formed concurrently with the trench in FIG. 11A. FIG. 11C illustrates that "lower insulator portion AILD2" is formed by embedding a silicon oxide film (SiO) 113 as an insulating material into the pattern formed in FIG. 11B.

Figure 11D:
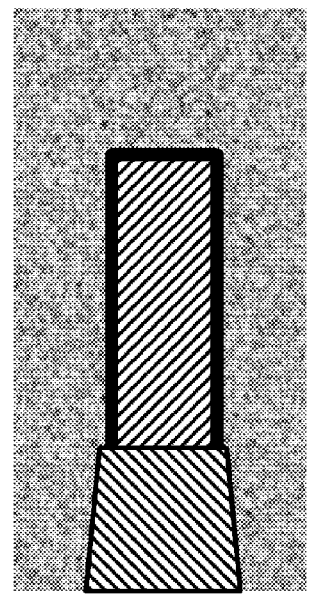
Figure 11E:
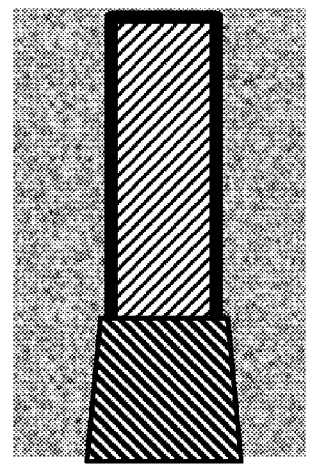

FIG. 11D illustrates that the substrate of FIG. 11C is vertically inverted. In FIGS. 11A to 11D, the thickness of the silicon (Si) is emphasized. Finally, as illustrated in FIG. 11E, the substrate of FIG. 11D is subjected to grinding performed in a BSI process, so that the silicon (Si) is 3 μm in thickness. The state of FIG. 11D is identical to the longitudinal structure of FIG. 10.

In the alignment mark produced in the above-mentioned steps, the centers of "upper insulator portion AILD1" and "lower insulator portion AILD2" are to be aligned but are actually misaligned within the accuracy of alignment (tolerance). This state will be referred to as "misalignment occurs". In the event of a misalignment Δ, the misalignment will be referred to as, for example, "a misalignment Δ occurs" or "a misalignment of Δ occurs".

Figure 12A:
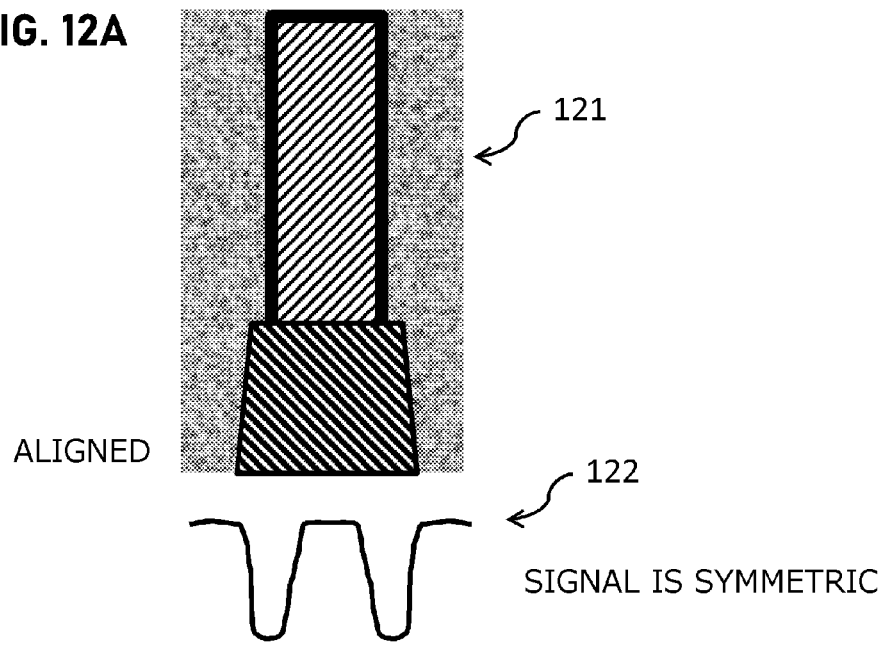
FIGS. 12A to 12C are explanatory drawings of the reasons why an alignment error occurs in the related art.
Figure 12B:
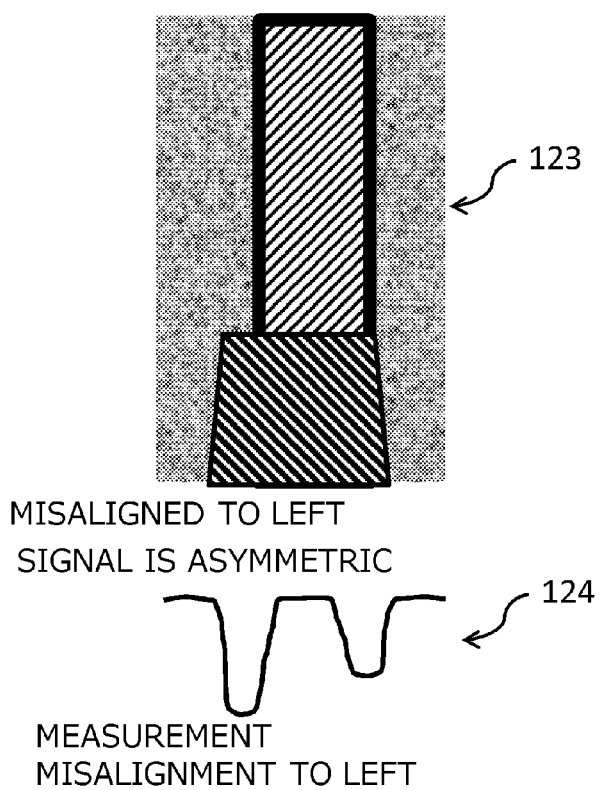
Figure 12C:
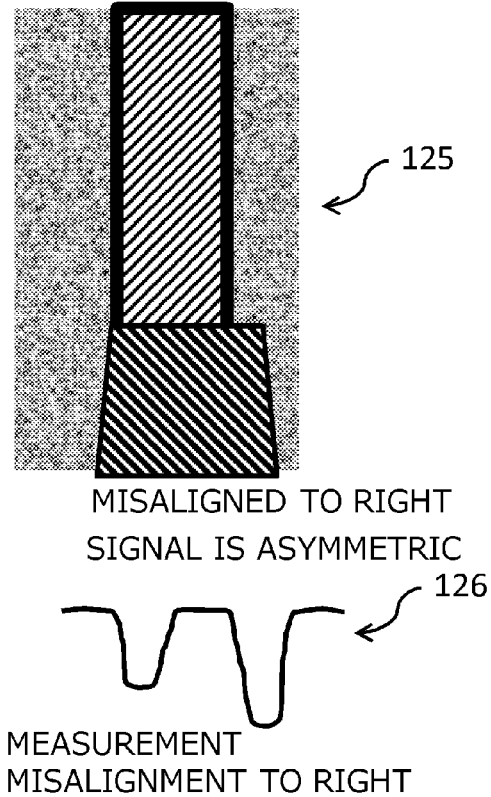

Referring to FIGS. 12A to 12C, observed misalignments of the alignment mark illustrated in FIG. 11E will be described below. FIG. 12A illustrates an ideal state 121 free from misalignment and a signal 122 detected when the state 121 is measured by the alignment detection system. The signal 122 is symmetrically generated without distortion and does not cause an alignment error.

FIG. 12B illustrates a state 123 in which a misalignment of +Δ occurs and a signal 124 detected when the state 123 is measured. In FIG. 12B, a misalignment of "lower insulator portion AILD2" from "upper insulator portion AILD1" to the left is defined as a positive misalignment. Because of the misalignment of +Δ, the signal 124 is asymmetrically generated with distortion and causes an alignment error. If the signal 124 is distorted, a position deviated from the center of the upper insulator portion AILD1 is detected as the position of the alignment mark, causing an alignment error. In the example of FIG. 12B, a position deviated from the center of the upper insulator portion AILD1 to the left (forward direction) is detected as the position of the alignment mark.

FIG. 12C illustrates a state 125 in which a misalignment occurs opposite to the direction of FIG. 12B, that is, a misalignment of −Δ occurs, and a signal 126 detected when the state 125 is measured. As in FIG. 12B, the signal 126 is asymmetrically generated with distortion, causing an alignment error. The alignment error occurs opposite to the direction of FIG. 12B.

In this way, an error of the detected position of the alignment mark may disadvantageously deteriorate the accuracy of alignment. The error is caused by a misalignment between the upper insulator portion AILD1 and the lower insulator portion AILD2.

Furthermore, a deterioration of overlay accuracy is known as a problem of a BSI sensor. In the process of forming the BSI sensor, overlay accuracy is deteriorated by distortion occurring over a wafer substrate in the step of bonding the inverted wafer substrate to another wafer substrate.

Figure 9:
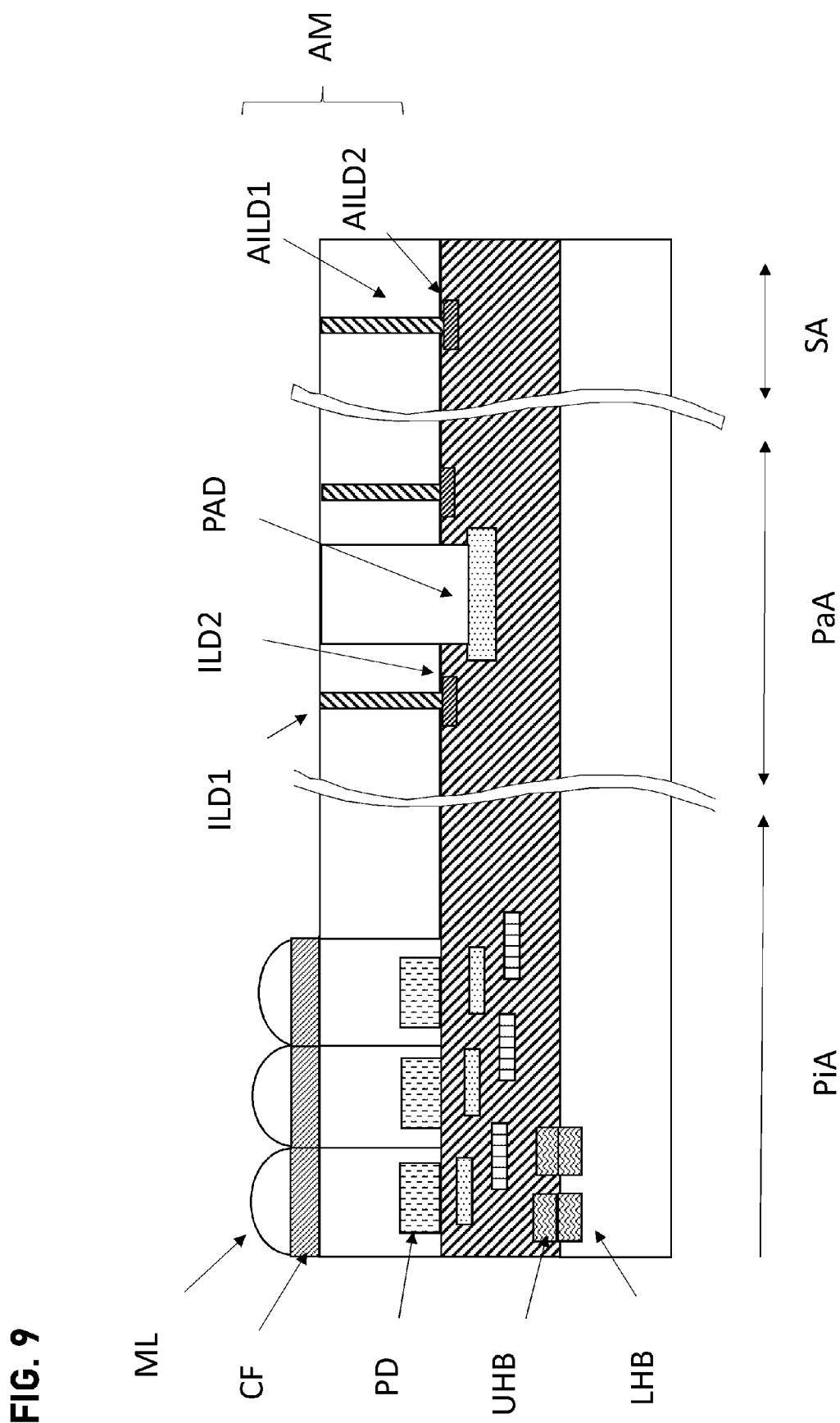
FIG. 9 is a schematic block diagram of a photoelectric converting device according to the related art (cross-sectional view)

The wafer substrates are typically bonded by Cu—Cu hybrid bonding. FIG. 9 illustrates that the two wafer substrates are bonded using an upper bonding mark UHB and a lower bonding mark LHB. The bonding cannot be evenly performed over the wafer substrates. The wafer substrates bonded from a specific portion are distorted in the plane direction of the wafer substrates. A lattice form for each shot is distorted when each shot is exposed by an aligner for integrated circuit manufacturing, in which a wafer stage is used to perform sub-nanometer control by means of a laser interferometer. This may deteriorate the overlay accuracy.

The measurements of all shots with the aligner and the nonlinear correction of reflected measurement results from an overlay tester are proposed and used. However, the throughput considerably decreases.

Hence, in a BSI sensor, an improvement of overlay accuracy is a significant matter for finer fabrication and high productivity in the future.

Embodiment 1

In the present embodiment, an alignment mark is proposed to prevent a deterioration of the accuracy of alignment even if a misalignment occurs between "lower insulator portion AILD2" and "upper insulator portion AILD1" that form the wafer alignment mark. By using the alignment mark proposed in the present embodiment, a BSI photoelectric converting device can be accurately and efficiently manufactured.

<Configuration>

Figure 1:
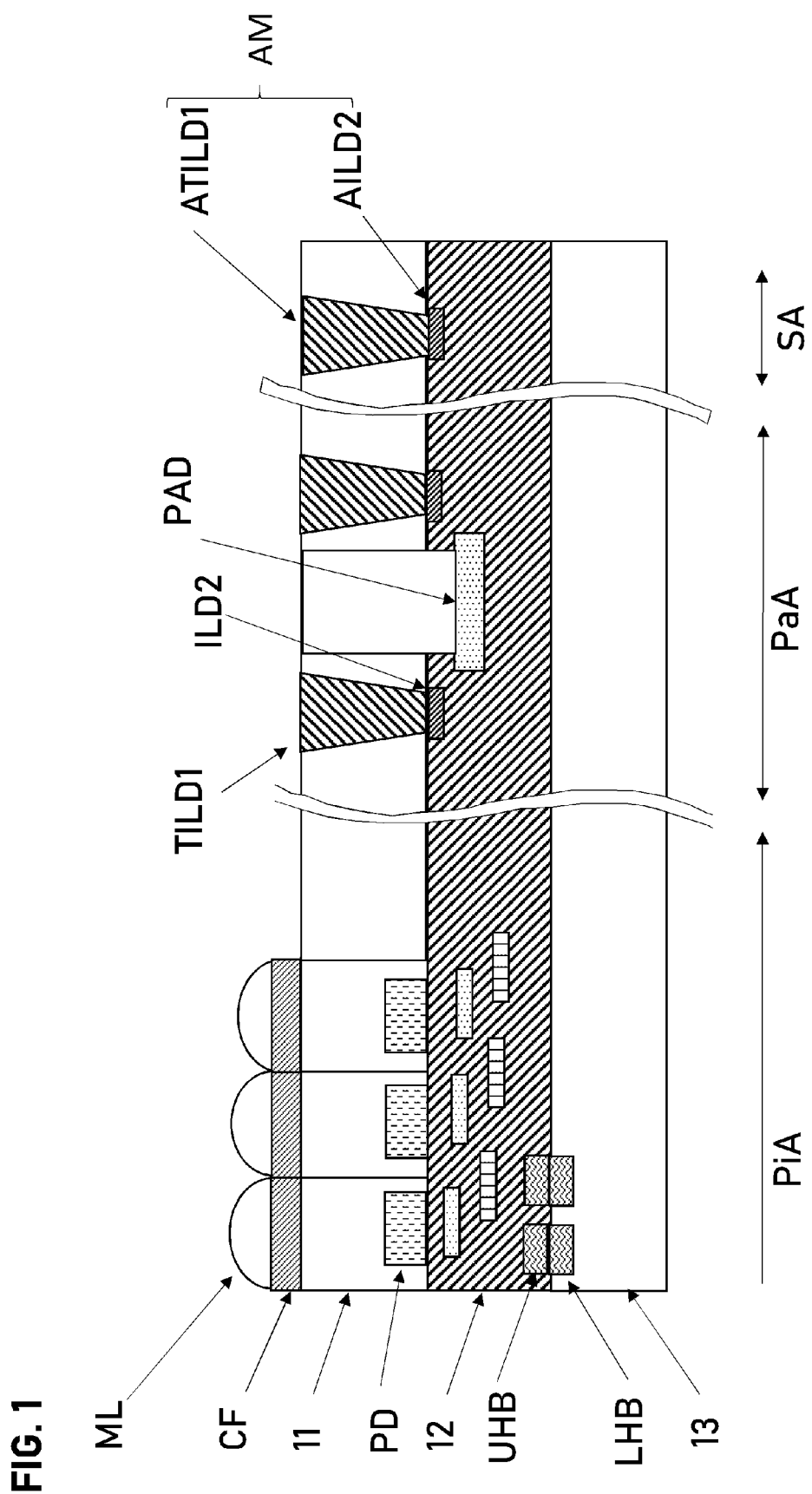
FIG. 1 is a schematic block diagram of a photoelectric converting device according to Embodiment 1 (cross-sectional view)

FIG. 1 is a schematic diagram of a photoelectric converting device according to the present embodiment. As illustrated in FIG. 1, the photoelectric converting device of the present embodiment includes, in an area surrounding a pixel area PiA, an alignment mark AM used for positioning during manufacturing and an electrode-pad formation area PaA having an electrode pad PAD used for connection to an external wire.

A backside-illumination photoelectric converting device 1 includes a semiconductor layer (silicon layer) 11 where photodiodes PD for photoelectric conversion are formed, a wire structure 12 formed on a front surface side of the semiconductor layer, and color filters CF and microlenses ML that are formed on the back surface side of the semiconductor layer. Moreover, a support substrate 13 is formed on one side of the wire structure 12 while the semiconductor layer 11 is in contact with the other side of the wire structure 12.

In the pixel area PiA of the semiconductor layer 11, the photodiodes PD are formed as light-receiving sensor portions. The light-receiving sensor portion performs photoelectric conversion for generating signal charge according to the quantity of received light. In the pixel area PiA, a pixel transistor (not shown) for driving a pixel is formed next to each pixel.

The wire structure 12 includes aluminum or copper wires and an interlayer insulating film. The wires are stacked in multiple layers (two layers in FIG. 1) with the interlayer insulating film interposed therebetween. A contact portion (not shown) makes an electrical connection between the wires or between the wire and the pixel transistor. Moreover, in the surrounding area, a part of the aluminum wire forms the electrode pad PAD.

The color filters CF are formed in areas for pixels on the back surface side of the semiconductor layer 11, the back surface side serving as the irradiation side of the semiconductor layer 11. For example, the color filters CF are made of organic materials including dyes of red (R), green (G), and blue (B). The microlenses ML are made of organic materials on the color filters CF for the pixels. The microlens ML focuses light such that the light is efficiently incident on the photodiode PD of the corresponding pixel.

The alignment mark AM is formed in a scribe area SA of the semiconductor layer 11. The upper insulator portion ATILD1 (first insulator portion) and the lower insulator portion AILD2 (second insulator portion) are stacked in the semiconductor layer. In this configuration, light to be received by the photodiode PD is incident on the upper side and thus the upper insulator portion ATILD1 is disposed closer to received light than the lower insulator portion AILD2. The upper insulator portion ATILD1 is connected to the lower insulator portion AILD2 at the lower side of the semiconductor layer 11. The lower insulator portion AILD2 covers the upper insulator portion ATILD1 and acts as a protective film. The alignment mark AM (upper insulator portion ATILD1) is used for positioning when the color filters CF and the microlenses ML are formed on the back surface side of the semiconductor layer 11.

Figure 2:
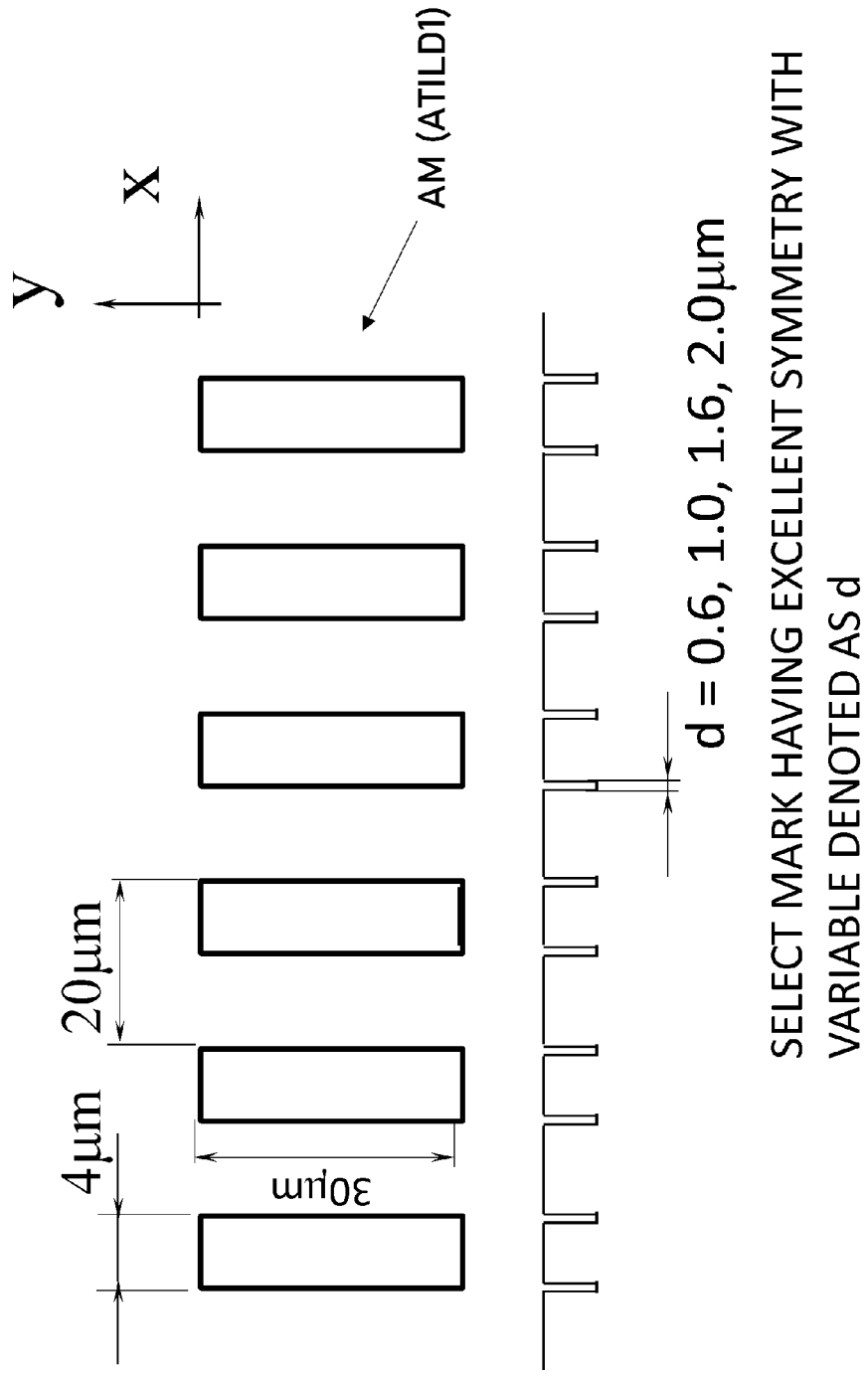
FIG. 2 illustrates the shape of an alignment mark for detecting a wafer alignment.

The alignment mark in the present embodiment is rectangular in plan view (see FIG. 2). As illustrated in FIG. 4A, the upper insulator portion ATILD1 tapers so as to increase in width toward the upper light-incident side. In the present disclosure, "width" of the alignment mark means a dimension in the width direction of the rectangle in plan view (x direction in FIG. 2). Furthermore, the longitudinal dimension of the upper insulator portion ATILD1 may increase toward the upper side. The shape of the lower insulator portion AILD2 is identical to that of FIG. 9 and has a substantially constant width regardless of the height. As illustrated in FIG. 2, the alignment marks are disposed in the scribe area SA. In order to detect a lateral position, the vertically oriented alignment marks are laterally disposed.

The alignment mark may be disposed outside the scribe area SA, that is, in a chip.

In the present embodiment, a width Wud at the upper end of the upper insulator portion ATILD1 (in other words, a maximum width) is larger than a width W2 of the lower insulator portion AILD2 by at least the double of an alignment error (tolerance) $\Delta_c$ during the formation of the insulator portions ATILD1 and AILD2. In other words, the width Wud at the upper end of the upper insulator portion ATILD1 is equal to or greater than the sum of the width of the lower insulator portion AILD2 and the double of the alignment error $\Delta_c$ (Wud≥W2+2×$\Delta_c$). With this configuration, as long as a misalignment $\Delta$ between the two insulator portions is equal to or smaller than the alignment error $\Delta_c$, the width of the lower insulator portion AILD2 is within the range of the width of the upper insulator portion ATILD1 in a top perspective view of the alignment mark. Specifically, in a top perspective view of the alignment mark, ends E2a and E2b in the width direction of the lower insulator portion AILD2 are located between ends E1a and E1b of the upper insulator portion ATILD1.

The lower end of the upper insulator portion ATILD1 (a portion connected to the lower insulator portion AILD2) has a smaller width than the lower insulator portion AILD2. Thus, the lower insulator portion AILD2 acts as a protective film.

The longitudinal dimension of the upper insulator portion ATILD1 may increase toward the upper light-incident side. In this case, in a top view of the alignment mark, that is, in a top perspective view in a direction perpendicular to the front surface of the silicon layer, the lower insulator portion AILD2 is located in the upper insulator portion ATILD1.

Insulator portions disposed around the electrode pad PAD in the electrode-pad formation area PaA also have two-layer structures like the alignment mark. An upper insulator portion TILD1 tapers so as to increase in width toward the upper light-incident side. The shape of a lower insulator portion ILD2 is identical to that of FIG. 9 and has a substantially constant width regardless of the height. A semiconductor substrate has an opening from which the electrode pad PAD is exposed so as to be drawn to the back surface side of the substrate. The provision of the insulator portions TILD1 and ILD2 can suppress leakage or damage even if the electrode pad PAD is brought into contact with a side wall by mistake during wire bonding or in a process of inspection. Furthermore, the lower insulator portion ILD2 has a small width, thereby reducing a stress generated near the electrode-pad formation area PaA. This can improve the manufacturing yield and quality of the photoelectric converting device.

<Effects>

Referring to FIGS. 4A to 4C, in the following description, even if a misalignment occurs between the upper insulator portion ATILD1 and the lower insulator portion AILD2 that constitute the alignment mark, the accuracy of alignment is not deteriorated during the formation of the color filters and the microlenses.

Figure 3:
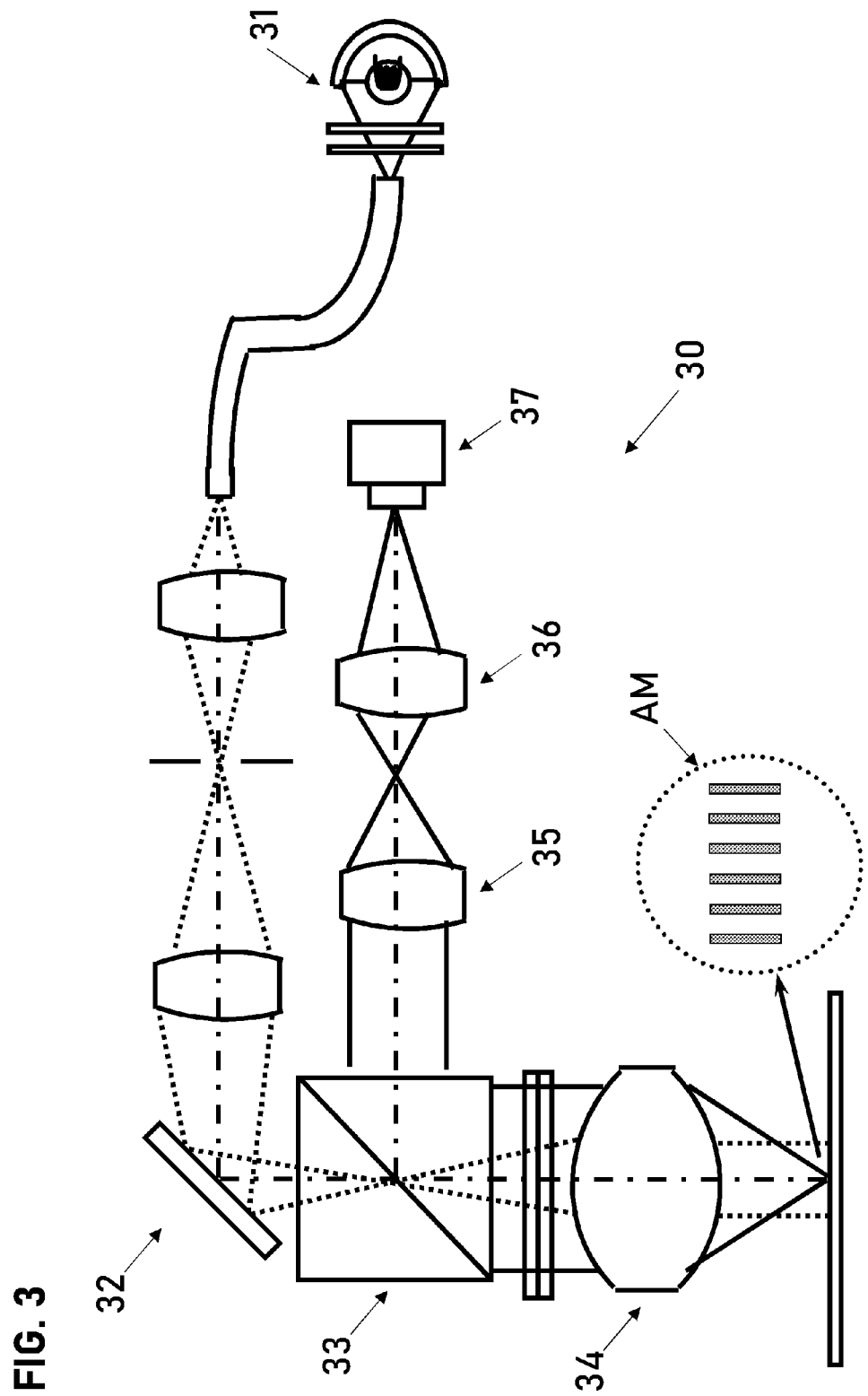
FIG. 3 illustrates the optical configuration of the wafer alignment detection system of an aligner for integrated circuit manufacturing.

FIG. 3 illustrates the configuration of an alignment detection system 30 used for detecting the alignment mark. The measurement method of the alignment detection system 30 in FIG. 3 is image processing. Light with a wavelength of 550 nm to 700 nm is emitted from a light source 31 and the alignment marks AM on a wafer are illuminated with the light through a reflector plate 32, a beam splitter 33, and a lens 34. Diffracted light from the alignment marks AM is magnified with an image-forming magnification of about 100 times through the lens 34, the beam splitter 33, and the lenses 35 and 36 and forms an image on a CCD camera 37. The CCD camera 37 transmits an imaging signal, which is obtained by photoelectric conversion on an optical image of the alignment mark AM, to a signal processing unit, and then the signal processing unit calculates position information on the alignment mark based on the imaging signal.

FIGS. 4A to 4C illustrate, as in FIGS. 12A to 12C, the states of the alignment mark and detected alignment signals in the absence of a misalignment, in the presence of a misalignment of +Δ, and in the presence of a misalignment of −Δ.

FIG. 4A illustrates an ideal state 41 free from misalignment and a detected alignment signal 42 as in FIG. 12A. The signal 42 detected by the alignment detection system 30 is symmetrically generated without distortion and does not cause an alignment error.

FIG. 4B illustrates, as in FIG. 12B, a state 43 in which a misalignment of +Δ occurs and a signal 44 detected when the state 43 is measured. In FIG. 4B, a misalignment of "lower insulator portion AILD2" from "upper insulator portion ATILD1" to the left is defined as a positive misalignment.

As described above, the width Wud of the upper part of the tapered insulator portion ATILD1 is larger than the double of Δ(<$Δ_c$) and the width W2 of the lower insulator portion AILD2. Hence, when the alignment mark is observed from above by the alignment detection system, the lower insulator portion AILD2 hidden behind the upper part of the insulator portion ATILD1 is not observed. As a result, the part (at least each end) of the detected alignment signal does not become asymmetric. Since the signal does not become asymmetric, the accuracy of alignment does not deteriorate, thereby solving the foregoing problem.

The alignment signal may be affected by "lower insulator portion AILD2" (though the signal is only slightly affected) depending upon the transmittance or the absorption index of the material or the wavelength of light used for detection. However, the upper insulator portion ATILD1 is tapered and thus an affected position can be displaced from each end of the alignment signal as in the part of a signal position Sib in FIG. 4B. The processing window of a part actually used for signal processing is an edge part, that is, each end of the alignment signal. Thus, the part of the signal position Sib does not affect the detection of the position of the alignment mark. This can accurately detect the position of the alignment mark even if a misalignment occurs between the upper and lower insulator portions.

FIG. 4C illustrates a state 45 in which a misalignment occurs opposite to the direction of FIG. 4B and a signal 46 detected when the state 45 is measured. Also in FIG. 4C, the accuracy of alignment does not deteriorate for the same reason as FIG. 4B and thus the detailed explanation is omitted.

Figures 5A, 5B:
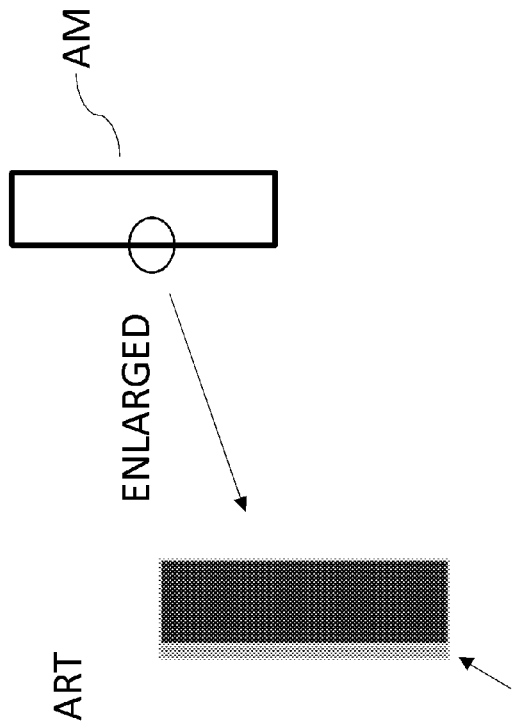
FIGS. 5A and 5B are explanatory drawings of the effect of Embodiment 1.

Referring to FIGS. 5A and 5B, another effect of the present embodiment will be described below. FIGS. 5A and 5B are enlarged views partially illustrating the alignment marks (FIGS. 12B and 4B) observed with misalignments by the alignment detection system of an aligner for integrated circuit manufacturing according to the related art and the present embodiment.

FIG. 5A is an enlarged view illustrating a part of the alignment mark proposed in the related art (Japanese Patent Application Publication No. 2011-14325). Because of the misalignment, the influence of the displaced lower insulator portion AILD2 appears on the left side. Thus, the end of the insulator portion AILD1 is erroneously detected, causing an error of the detected position of the alignment mark (upper insulator portion AILD1).

FIG. 5B is an enlarged view illustrating a part of the alignment mark according to the present embodiment. Even under the influence of the lower insulator portion because of the misalignment, the end of the mark is not affected. Thus, the position of the alignment mark can be accurately detected. In short, a deterioration of the accuracy of alignment can be prevented.

As described above, "lower insulator portion AILD2" acts as a protective film but does not act as an alignment mark.

<Manufacturing Method>

Referring to FIGS. 6A to 6F, the process of forming the tapered insulator portion ATILD1 that constituted the alignment mark according to the present embodiment is described.

Figure 6A:
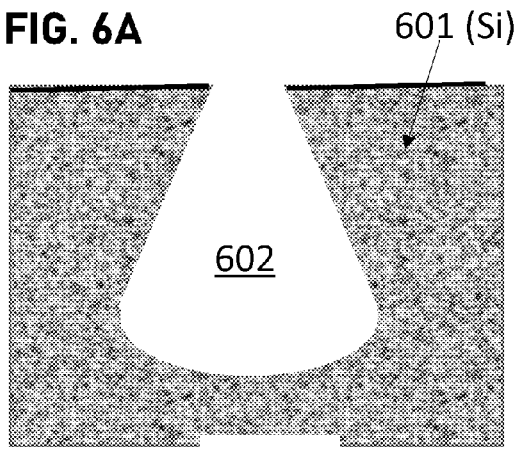
FIGS. 6A to 6F are explanatory drawings illustrating the steps of forming an alignment mark according to Embodiment 1.
Figure 6B:
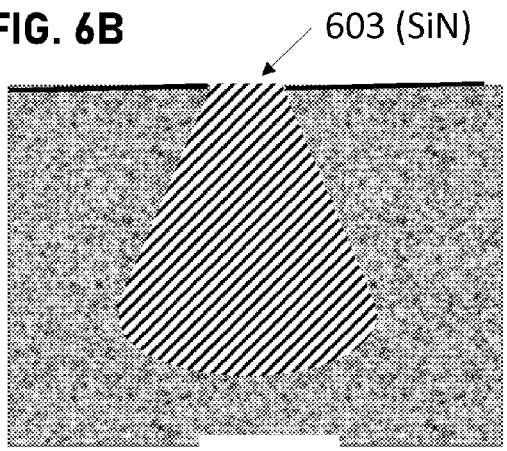
Figure 6C:
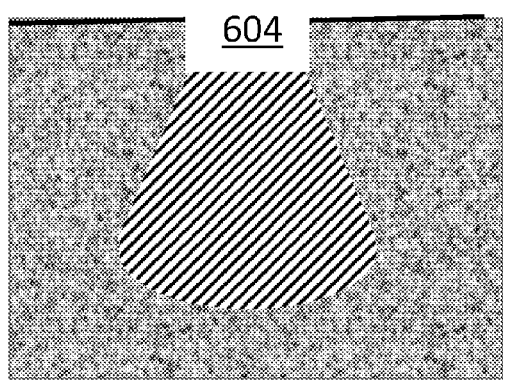

First, as illustrated in FIG. 6A, a reverse-tapered trench 602 is formed on a silicon wafer 601 by the exposure, development, and etching of lithography. FIGS. 6A to 6C illustrate a state before the substrate is vertically inverted. The lower sides of the drawings turn "upper parts" in the end.

A dry etching apparatus used to perform the process is not particularly limited. The dry etching apparatus may be, for example, an ICP etching apparatus, a magnetron RIE etching apparatus, or a double-channel parallel-plate-type etching apparatus.

For example, the reverse tapered trench 602 in FIG. 6A can be formed by etching the silicon 601 with silicon dioxide $SiO_2$ serving as an etching mask under the following etching conditions.

Process gas pressure: 10 to 200 mTorr
Upper RF power: 100 to 2000 W
Lower RF power: 100 to 2000 W
HBr gas flow rate: 20 to 300 sccm
NF3 gas flow rate: 0 to 200 sccm O2 gas flow rate: 0 to 50 sccm Thereafter, as illustrated in FIG. 6B, a silicon nitride film (SiN) 603 is embedded into the trench 602. The silicon nitride film 603 serves as the upper insulator portion ATILD1 in the end.

Subsequently, as illustrated in FIG. 6C, a pattern 604 serving as "lower insulator portion AILD2" is formed on the silicon nitride film 603 (upper insulator portion ATILD1) by the alignment, exposure, development, and etching of lithography. For the alignment of this step, the alignment mark (not shown) formed concurrently with the trench 602 in FIG. 6A is used.

Figure 6D:
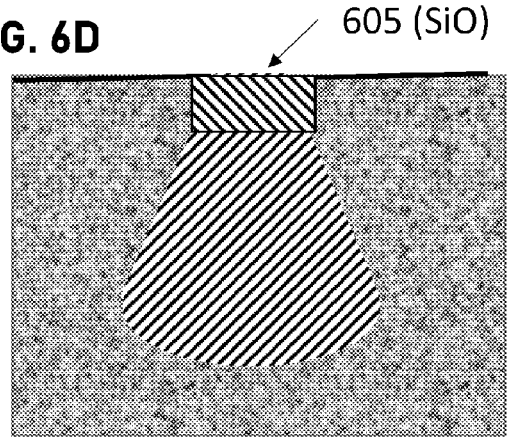

Thereafter, as illustrated in FIG. 6D, a silicon oxide film (SiO) 605 is embedded as an insulating material into the pattern 604 formed in FIG. 6C. The silicon oxide film 605 serves as the lower insulator portion AILD2 in the end.

Figure 6E:
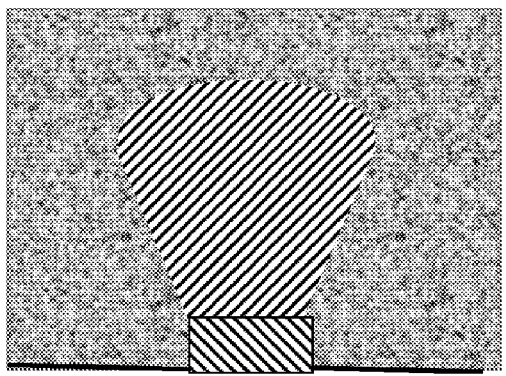

Subsequently, as illustrated in FIG. 6E, the substrate in FIG. 6D is vertically inverted. In FIGS. 6A to 6E, the thickness of the silicon (Si) 601 is emphasized.

Figure 6F:
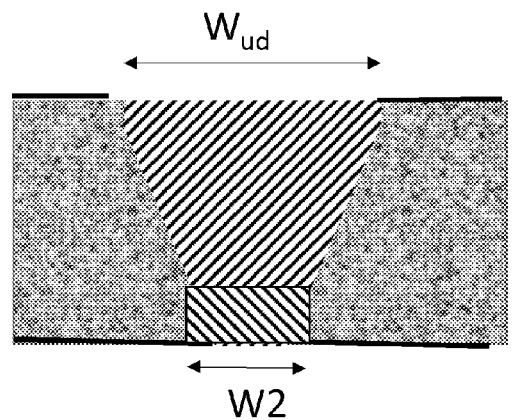

Thereafter, as illustrated in FIG. 6F, grinding for a BSI process is performed on the substrate of FIG. 6E, so that the silicon (Si) 601 has a thickness of 3 μm.

This process can form the alignment mark used for lithography for forming the color filters and the microlenses in the BSI process.

The insulator portions TILD1 and ILD2 around the electrode pad PAD are also formed by the process concurrently with the alignment mark.

Advantageous Effect of Present Embodiment

According to the present embodiment, the light-receiving sensor portions (photodiodes PD or the like) can be accurately aligned with the color filters CF and the microlenses ML by using, as alignment marks, the insulator portions embedded in the tapered trenches around an imaging area. Hence, the present embodiment can accurately and efficiently produce the photoelectric converting device having a BSI structure. Moreover, the present embodiment can improve the manufacturing yield and quality of the photoelectric converting device. The photoelectric converting device having the BSI structure can obtain oblique incident light with 100% effective aperture ratio, remarkably improve the sensitivity, and eliminate shading.

Embodiment 2

The shape of an alignment mark is not limited to the structure illustrated in Embodiment 1 (FIGS. 1 and 4A). The present embodiment is a photoelectric converting device including the alignment mark having a different shape from Embodiment 1.

Figure 7:
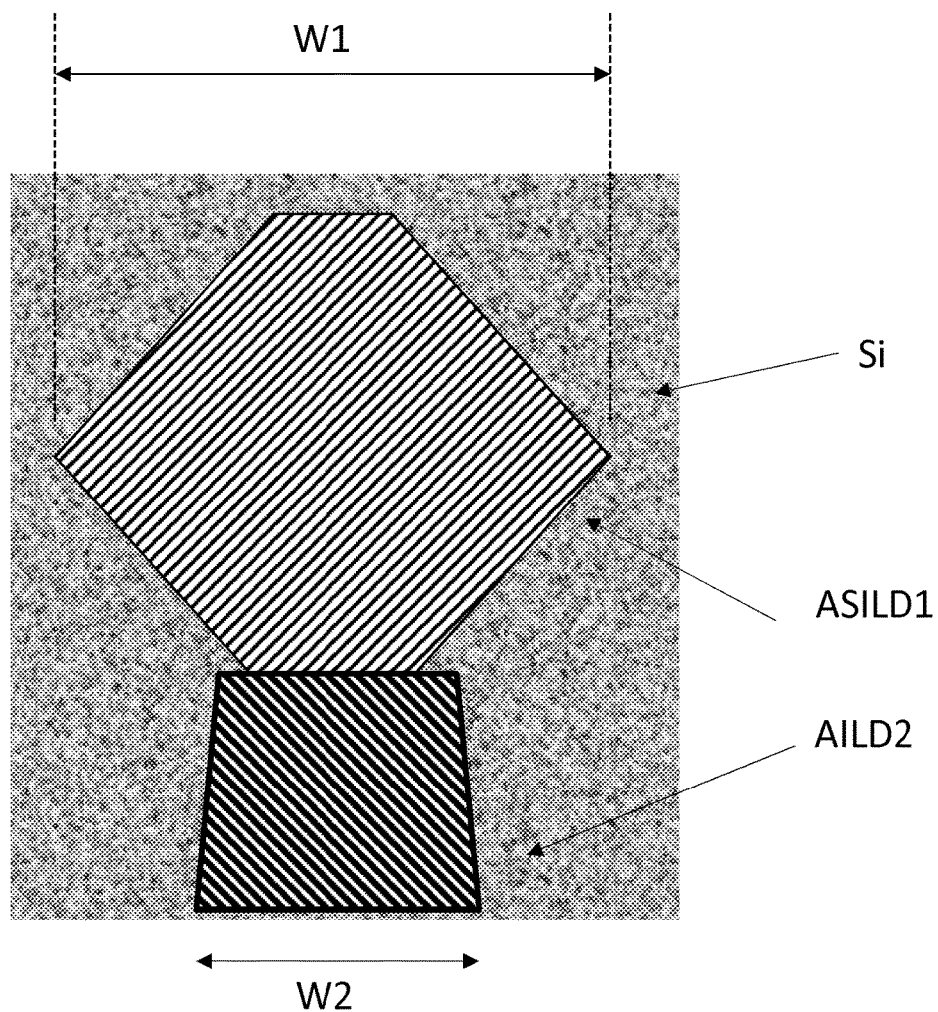
FIG. 7 illustrates the structure of an alignment mark according to Embodiment 2.

FIG. 7 illustrates the structure of the alignment mark according to the present embodiment. The alignment mark according to the present embodiment includes an upper insulator portion ASILD1 and a lower insulator portion AILD2. The upper insulator portion ASILD1 has a maximum width at an intermediate portion in the vertical direction. A maximum width W1 of the insulator portion ASILD1 is larger than a width W2 of the insulator portion AILD2 by at least the double of an alignment error $\Delta_c$ of the insulator portion as in Embodiment 1. In other words, the maximum width W1 of the upper insulator portion ASILD1 is not smaller than the sum of the width of the lower insulator portion AILD2 and the double of the alignment error $\Delta_c$ (W1≥W2+2×$\Delta_c$). The same effect as Embodiment 1 can be obtained by the shape of the alignment mark.

The manufacturing method of the alignment mark according to the present embodiment is basically similar to that of Embodiment 1. In the present embodiment, however, etching for forming a trench on a silicon wafer is performed as follows: specifically, etching step 1 and etching step 2 are repeated two or more times. Thus, the trench shaped as illustrated in FIG. 7 can be formed by etching silicon with silicon dioxide $SiO_2$ serving as an etching mask.

Etching Step 1
Process gas pressure: 20 to 150 mTorr
High-frequency source power: 400 to 1800 W
RF bias power: 150 to 1000 W
Cl2 flow rate: 30 to 300 sccm
O2 flow rate: 0 to 30 sccm
N2 flow rate: 0 to 100 sccm
He flow rate: 0 to 500 sccm Etching Step 2
Process gas pressure: 3 to 50 mTorr
High-frequency source power: 200 to 1500 W
RF bias power: 0 to 500 W
SF6 flow rate: 10 to 300 sccm Embodiment 3

In the examples of Embodiments 1 and 2, the present invention is applied to the alignment marks of the aligner for integrated circuit manufacturing, whereas in the present embodiment, the present invention is applied to overlay test masks. This can achieve an accurate overlay test without being affected by the accuracy of alignment of two layers.

Figure 8A:
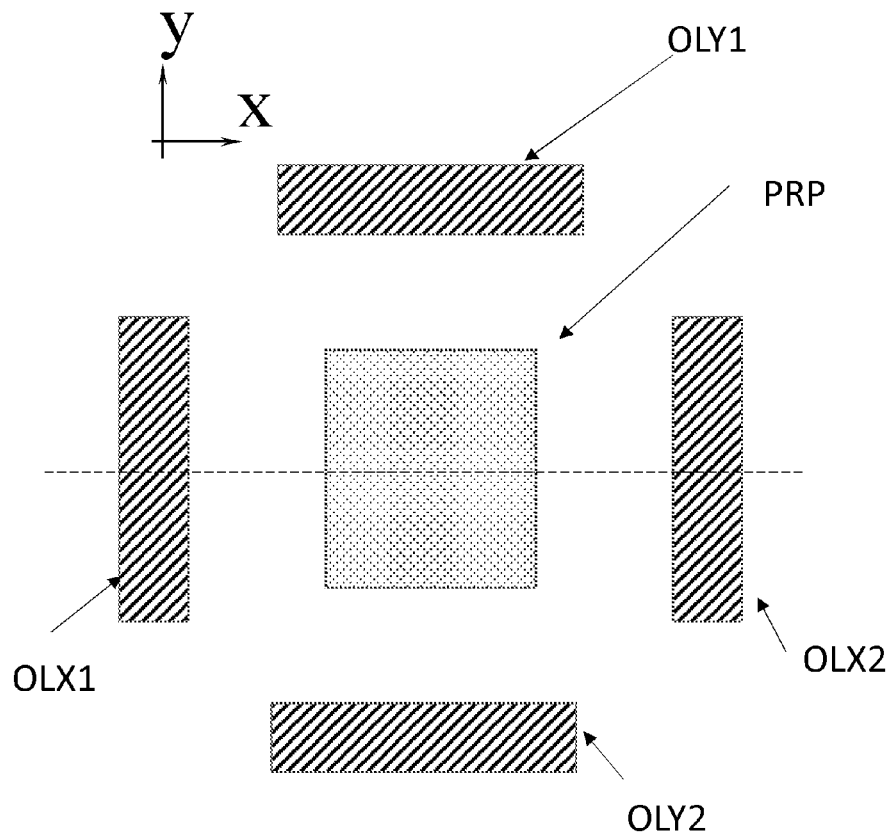
FIGS. 8A and 8B are explanatory drawings of measurement marks for an overlay test according to Embodiment 2.
Figure 8B:
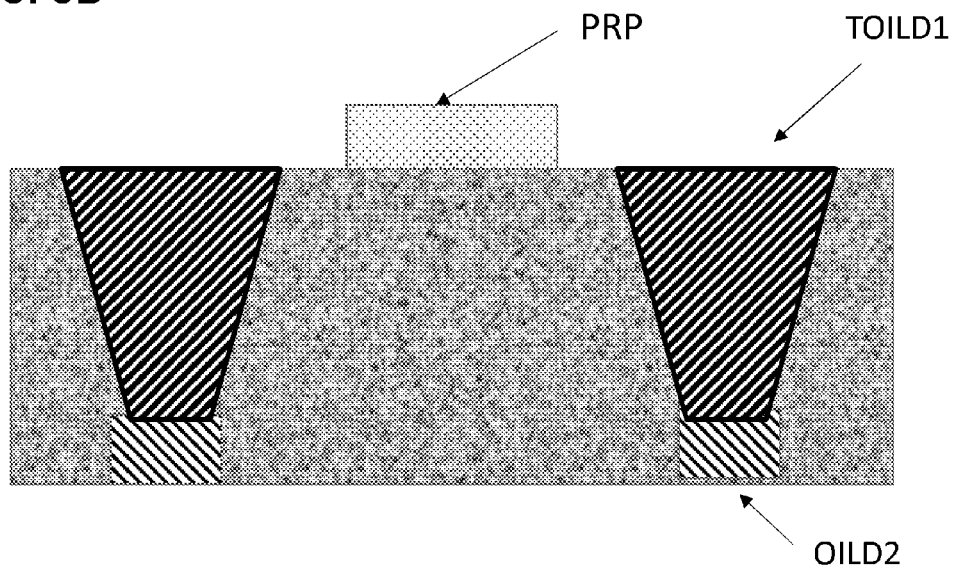

FIGS. 8A and 8B illustrate an example in which the present invention is applied to measurement marks for an overlay test. FIG. 8A is a top view. FIG. 8B is a cross-sectional view taken along a broken line in FIG. 8A.

The principle of measurement of a commercial overlay tester is image processing, which is similar to the optical configuration of the wafer alignment detection system of the aligner for integrated circuit manufacturing according to Embodiment 1. Thus, the accuracy of alignment may similarly decrease according to a misalignment of the mark for an overlay test.

In an overlay test, a relative positional relationship is measured between an overlay test mark PRP for a resist pattern that is aligned, exposed, and developed by an aligner and overlay test marks OLX1, OLX2, OLY1, and OLY2 that are formed in advance.

The test marks OLX1, OLX2, OLY1, and OLY2 each include an upper insulator portion TOILD1 and a lower insulator portion OILD2. Like the alignment mark of the aligner, as illustrated in FIG. 8B, a mark OLILD1 formed on the upper insulator portion has a larger width than a mark OLILD2 formed on the lower insulator portion. This prevents the influence of the mark OLILD2 of the lower insulator portion, achieving an accurate overlay test.

In FIGS. 8A and 8B, the upper insulator portion TOILD1 is tapered as in Embodiment 1. The upper insulator portion may have a maximum width at an intermediate portion as in Embodiment 2.

Other Embodiments

In the foregoing explanation, the two-layer insulator portions include the silicon nitride film SiN and the silicon oxide film SiO, respectively. The present invention is not limited to this configuration. For example, each of the two-layer insulator portions may include the silicon nitride film SiN or the silicon oxide film SiO. This configuration can obtain the same effect. This is because the alignment mark is preferably configured without performing lithography twice.

In the foregoing embodiments, the wire structure 12 including the insulating film, the insulator portions ATILD1 and TILD1, and the insulator portions AILD2 and ILD2 are provided, the wire structure 12 being disposed on the front surface of the semiconductor layer 11 having an photoelectric conversion portion. The insulator portions ATILD1 and TILD1 are disposed in the trenches provided in the semiconductor layer 11. The insulator portions AILD2 and ILD2 are disposed between the insulator portions ATILD1 and TILD1 and the insulating film of the wire structure 12. The maximum width of the insulator portions ATILD1 and TILD1 is larger than the maximum width of the insulator portions AILD2 and ILD2. Thus, a possible stress between the wire structure 12 and the semiconductor layer 11 can be reduced as compared with the case where the maximum width of the insulator portions ATILD1 and TILD1 is smaller than the maximum width of the insulator portions AILD2 and ILD2. This can improve the manufacturing yield and quality of the photoelectric converting device. As described above, the insulator portions ATILD1 and TILD1 and the insulator portions AILD2 and ILD2 can be used as alignment marks, test marks, and insulating members around the electrode pad. The insulator portions AILD2 and ILD2 may be disposed in the trenches provided in the semiconductor layer 11. The alignment marks and the test marks may be disposed in a scribe line or a chip.

The photoelectric converting device of the present embodiment can be installed in electronic devices such as a camera and an information terminal, vehicles such as an automobile, ships, airplanes, transportation equipment for artificial satellites, medical equipment, and analyzers. Such equipment may include at least one of an optical system, a controller, a processor, a display device, a storage device, and a machine device in addition to the photoelectric converting device. The optical system is configured to form an image on the photoelectric converting device. The controller is configured to control the photoelectric converting device. The processor is configured to process a signal outputted from the photoelectric converting device. The display device is configured to display information obtained in the photoelectric converting device. The storage device is configured to store the information obtained in the photoelectric converting device. The machine operates based on the information obtained in the photoelectric converting device. The photoelectric converting device according to the present embodiment installed in various devices can improve the values of the devices.

The present invention is not limited to the foregoing embodiments and can be configured in various ways within the scope of the present invention.

For example, insulator portions stacked like the insulator portions ATILD1 and TILD1 and the insulator portions AILD2 and ILD2 can be used as insulating members for insulating portions of the semiconductor layer, for example, insulating members for separating pixels.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-202787, filed on Oct. 29, 2018, which is hereby incorporated by reference herein in its entirety.

What is claimed is:

1. A photoelectric converting device comprising:
   a semiconductor layer with a front surface and a back surface, the semiconductor layer including a first area and a second area, the first area including a photoelectric conversion portion and the second area being in a different position from the first area;
   a wire structure including an insulating film, the wire structure being disposed on the front surface of the semiconductor layer;
   a first insulator portion disposed in a first trench provided in the semiconductor layer; and
   a second insulator portion that is disposed between the first insulator portion and the insulating film in a second trench provided in the semiconductor layer, and that has an end contacted to an end of the first insulator portion,
   wherein the first insulator portion and the second insulator portion are arranged in the second area, and
   wherein the first trench contains a portion of the first insulator portion, and the portion of the first insulator portion contained in the first trench has a first maximum width larger than a second maximum width of the second insulator portion disposed in the second trench, and
   wherein the first maximum width is equal to or greater than a sum of (a) a width of the second insulator portion disposed in the second trench and (b) two times an alignment error during formation of the second insulator portion, wherein the alignment error is greater than zero.

2. The photoelectric converting device according to claim 1, wherein the first insulator portion has a first connecting portion connected to the second insulator portion, and
   wherein the first connecting portion of the first insulator portion has a width smaller than a width of a second connecting portion of the second insulator portion, the second connecting portion of the second insulator portion being connected to the first connecting portion of the first insulator portion.

3. The photoelectric converting device according to claim 1, wherein in a top perspective view in a direction perpendicular to the front surface of the semiconductor layer, the second insulator portion is located in the first insulator portion.

4. The photoelectric converting device according to claim 1, wherein the first insulator portion increases in width toward the back surface side from the front surface side.

5. The photoelectric converting device according to claim 1, wherein the first insulator portion has the maximum width at an intermediate portion.

6. The photoelectric converting device according to claim 1, wherein the first insulator portion is a wafer alignment mark.

7. The photoelectric converting device according to claim 1, wherein the semiconductor layer is stacked on the wire structure including an electrode pad and has an opening from which the electrode pad is exposed, and
   wherein the first insulator portion and the second insulator portion are disposed around the opening.

8. The photoelectric converting device according to claim 1, wherein the first insulator portion is an overlay test mark.

9. An apparatus comprising:
   the photoelectric converting device according to claim 1; and
   at least one of: an optical system configured to form an image on the photoelectric converting device; a controller configured to control the photoelectric converting device; a processor configured to process a signal outputted from the photoelectric converting device; a display device configured to display information obtained in the photoelectric converting device; a storage device configured to store information obtained in the photoelectric converting device; and a machine configured to operate on the basis of information obtained in the photoelectric converting device.

10. The photoelectric converting device according to claim 1, wherein the first trench and the second trench are formed in different steps.

11. The photoelectric converting device according to claim 1, wherein the first trench has a first shape which comprises a tapered shape or a reverse-tapered shape, and
wherein the second trench has a second shape different from the first shape.

12. The photoelectric converting device according to claim 1, further comprising a substrate,
wherein the wire structure is arranged between the semiconductor layer and the substrate.

13. The photoelectric converting device according to claim 12, wherein the semiconductor layer and the substrate are bonded by Cu—Cu hybrid bonding.

14. The photoelectric converting device according to claim 1, further comprising another set of the first insulator portion and the second insulator portion.

15. The photoelectric converting device according to claim 1, wherein the first insulator portion has a rectangular shape on the back surface having a long side and a short side.

* * * * *